United States Patent
Gaultier et al.

[11] Patent Number: 5,889,702
[45] Date of Patent: Mar. 30, 1999

[54] READ CIRCUIT FOR MEMORY ADAPTED TO THE MEASUREMENT OF LEAKAGE CURRENTS

[75] Inventors: Jean-Marie Gaultier, Rousset; Emilio Miguel Yero, Aix-En-Provence, both of France

[73] Assignee: SGS-Thomson Microelectronics, S.A., Gentilly, France

[21] Appl. No.: 31,748

[22] Filed: Feb. 27, 1998

[30] Foreign Application Priority Data

Mar. 11, 1997 [FR] France .................................. 97 03219

[51] Int. Cl.[6] .................................................. G11C 16/06
[52] U.S. Cl. ................................. 365/185.2; 365/185.21; 365/210
[58] Field of Search .......................... 365/185.21, 185.2, 365/185.25, 210

[56] References Cited

U.S. PATENT DOCUMENTS

| | | | |
|---|---|---|---|
| 5,267,202 | 11/1993 | Dallabora et al. | 365/185.21 |
| 5,432,764 | 7/1995 | Guedj | 365/185.21 |
| 5,530,403 | 6/1996 | Bushman et al. | 330/253 |
| 5,544,114 | 8/1996 | Gaultier et al. | 365/185.21 |
| 5,699,295 | 12/1997 | Yero | 365/185.21 |
| 5,717,640 | 2/1998 | Hashimoto | 365/185.21 |
| 5,729,492 | 3/1998 | Campardo | 365/185.21 |

FOREIGN PATENT DOCUMENTS

| | | | |
|---|---|---|---|
| 0 568 439 A1 | 4/1993 | European Pat. Off. | G11C 29/00 |
| WO 92/02934 | 2/1992 | WIPO | G11C 16/06 |

OTHER PUBLICATIONS

Roberto Gastaldi, "A 1-Mbit CMOS EPROM with Enhanced Verification," IEEE Journal of Solid-State Circuits, vol. 23, No. 5, Oct. 1988.

*Primary Examiner*—Son T. Dinh
*Attorney, Agent, or Firm*—Allen, Dyer, Doppelt, Milbrath & Gilchrist, P.A.

[57] ABSTRACT

The circuit is for the measurement of the current of the memory cells of an electrically modifiable non-volatile memory. The read circuit is complemented by two current sources to improve the biasing of the current mirror of the read circuit during the measurement.

10 Claims, 1 Drawing Sheet

READ CIRCUIT FOR MEMORY ADAPTED TO THE MEASUREMENT OF LEAKAGE CURRENTS

FIELD OF THE INVENTION

The present invention relates to memories, and, more particularly, to the read circuits of electrically modifiable non-volatile integrated memories. It can be applied more particularly in the field of "FLASH EEPROM" type memories.

BACKGROUND OF THE INVENTION

The methods used to manufacture integrated circuits very often introduce defects. Thus, after manufacture, each integrated circuit is subjected to tests aimed at detecting the presence of such defects. In the case of non-volatile memories, it is ascertained first of all that the column and row decoders of the memory are working properly by programming cells of the memory array in predetermined configurations, and then carrying out successive readings of these same cells. Any divergence between the data elements that should have been written and the data elements read indicates the presence of a defect.

The leakage current of these memory cells is then measured, and, thus, it is ascertained that the value of this leakage current is acceptable or not acceptable. The source of these leakage currents is varied: it may be the presence of electrical charges in the oxide layer of the transistor of the memory cell or a defect in the structure of the memory cell that, for example, generates a leakage current.

At the present time, this measurement of leakage current is an analog measurement done by means of a testing apparatus whose inputs are connected to the external terminals of the memory to be tested. In practice, a cell to be tested is selected by the application to its grid of a zero voltage, and the current flowing in the bit line connected to this cell is measured. The leakage current is then accessible on the data pad associated with the cell, care being taken to short-circuit the read circuit connected to the bit line concerned. The value of the leakage current measured is then compared with a current threshold value indicating whether the cell is defective or not. Typically, the maximum leakage current acceptable for a cell is in the range of 10 microamperes for a reference current in the range of 50 to 100 microamperes. The testing apparatus is generally a programmed unit designed to generate the addresses of the memory cells of the matrix one-by-one, and measure the leakage current flowing in the corresponding bit line for each of the memory cells.

The main drawback of this measurement of the leakage current lies in its relatively lengthy performance time, for it is an analog measurement. The use of equipment external to the memory is another drawback for it is liable to introduce unwanted currents, and, hence, falsify the measurement of the leakage current.

One approach to address these drawbacks includes using the read circuit of the memory to perform this measurement. Usually, the read circuit of a non-volatile memory is entrusted with the task of comparing the current flowing through a memory cell with a reference current during a reading phase. During the reading phase a read voltage is applied to the grid of the memory cell to be read. The read circuit then delivers a logic data element indicating whether the current of the cell is smaller than or greater than the reference current which, for its part, is set by a reference cell.

To measure the leakage current of a memory cell, it would be enough to apply a zero voltage to the grid of the memory cell to be tested and then compare the leakage current with a reference current equal to a predetermined maximum leakage current. However, this technique, which could very easily be implemented in standard memories, is not very precise. Indeed, when the reference current is very low, in the range of some microamperes, the low value of the reference current can no longer be used for the accurate biasing of the current mirror of the read circuit, since the gate-source voltage of the transistors of the current mirror tends to approach the conduction threshold Vt of the transistors. The duplication of the current by the current mirror becomes imprecise and the read circuit is very sensitive to noise.

SUMMARY OF THE INVENTION

The invention therefore is directed to improving the read circuit of an electrically modifiable non-volatile memory so that it can be used to measure the leakage current of the cells of a memory.

The invention is directed to a memory in integrated circuit form. The memory comprises at least one bit line to which there are connected memory cells and a reference line similar to the bit line to which there is connected a reference cell, and a read circuit comprising comparison means and means for the precharging of the bit line and reference line. The comparison means preferably comprises:

- a reference transistor and a copying transistor with a ratio k of the current flowing in the reference transistor, the transistors being respectively connected to the reference line and to the bit line through precharging means;
- a differential amplifier;
- wherein the memory further comprises a first current source connected to the reference line and a second current source connected to the bit line to provide first and second currents, respectively, in a direction tending to modify the bias of the comparison means of the read circuit during a phase for the measurement of the leakage current of any one of the memory cells;
- and wherein the value of the second current is equal to k times the value of the first current;
- and wherein the value of the reference current flowing in the reference cell is equal to 1/k times the value of a maximum leakage current, the value of the maximum leakage current being a predetermined value.

Thus, if the comparison means of the read circuit is appropriately biased during this measurement phase, the differential amplifier is capable of providing a reliable logic information element on the value of the leakage current of the tested cell. Apart from this measurement phase, the first and second current sources do not deliver any current.

BRIEF DESCRIPTION OF THE DRAWING

Other features and advantages of the invention shall appear from the following detailed description made with reference to the appended sole drawing, namely.

DETAILED DESCRIPTION OF THE PREFERRED EMBODIMENTS

Figure 1:
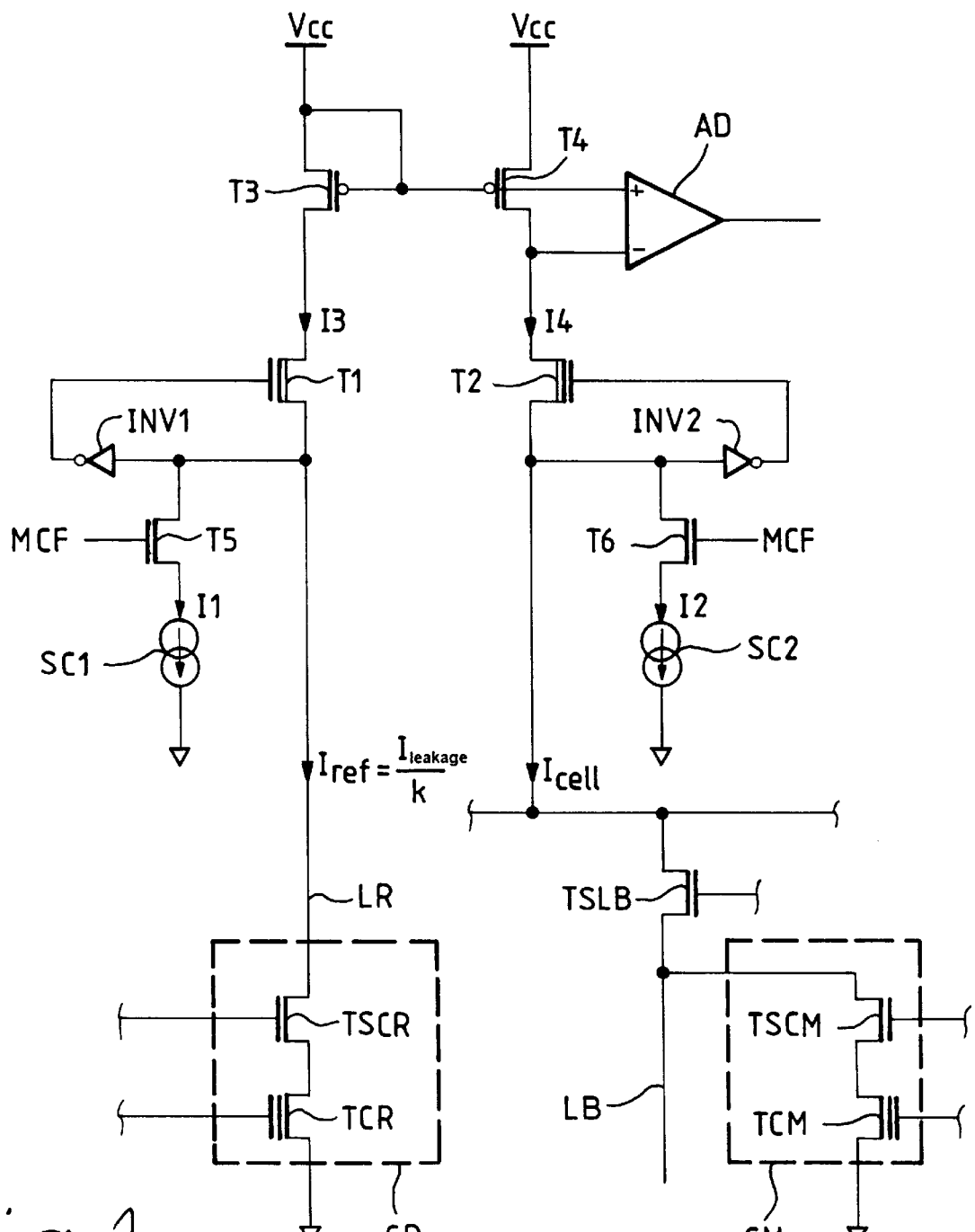
FIG. 1 which is a drawing of a read circuit according to the invention.

The general structure of the read circuit according to the invention is shown in FIG. 1. Its operation for the measurement of the leakage current of the memory cells is then explained with reference to this Figure. A memory cell CM located at the intersection of a bit line LB and a word line LM delivers an information element representing its conduction state on the bit line LB. The memory cell is provided, in the example of FIG. 1, by a floating gate transistor TCM series-connected with a selection transistor TSCM. The bit line LB is selected by a selection transistor TSLB and precharged in voltage, during a precharging phase, by a precharging transistor T2. The bit line is generally precharged at a potential close to 2 volts and is crossed by a current $I_{cell}$ coming from the memory cell CM.

A reference cell CR including a floating-gate transistor series-connected with a selection transistor TSCR is connected to a reference line LR having the same characteristics as the bit line LB, especially with respect to parasitic capacitances. This reference line is precharged by means of a precharging transistor T1 at the same precharging potential as the bit line LB. A balancing transistor connecting the lines LB and LR could be added to equalize the potentials of the two lines during a balancing phase following the precharging phase. The reference line is furthermore crossed by a reference current $I_{ref}$ coming from the reference cell CR.

The source and the control gate of the precharging transistor T1 are connected together by an inverter INV1. In an identical way, the source and the control gate of the precharging transistor T2 are connected by means of an inverter INV2. The size of the transistors of the inverters INV1 and INV2 is chosen so that, in cooperation with the precharging transistors, a stable voltage of about 2 volts is obtained at input of the inverters.

The drains of the transistors T1 and T2 are supplied by the two arms of a current mirror with a copying ratio k smaller than 1. The first arm of the current mirror has a reference transistor T3 crossed by a current I3. The second arm of the current mirror has a copying transistor T4 crossed by a current I4. The copying transistor T4 tends to make a copy, with a ratio k, of the current I3 flowing in the reference transistor T3. The copying ratio k corresponds to the ratio of the geometries of the transistors. Its value typically is equal to ½.

The reference transistor T3 is a P channel transistor having its source connected to a voltage supply Vcc terminal and its drain connected to the drain of the precharging transistor T1. The copying transistor T4 is also a P channel transistor whose source is connected to the supply Vcc terminal and whose drain is connected to the drain of the precharging transistor T2. The control gates of the transistors T3 and T4 are connected to each other and the control gate of the reference transistor T3 is connected to its drain (in a diode configuration).

Finally, a differential amplifier AD has its inputs connected to the drains of the transistors T3 and T4 and amplifies the difference between the potentials at these two drains. This difference is zero if the currents flowing through the transistors T3 and T4 are equal in the ratio k. Otherwise, if this difference is not zero, the output of the amplifier AD indicates whether the ratio of the current is smaller than or greater than k.

To carry out the measurement of the leakage current of the memory cell, the read circuit is complemented with two current sources SC1 and SC2. This measurement of the leakage current of the cell CM is done at the end of manufacture when the memory cell CM is still blank. In the example of FIG. 1, the current sources SC1 and SC2 are respectively connected to the source of the precharging transistors T1 and T2 by means of the pass transistors T5 and T6. The transistors T5 and T6 are turned on during the phase of measurement of the leakage current of the cell CM, by the application of a voltage MCF to their control gates.

During the phase for the reading of the memory cell CM, the reference line LR is crossed by a reference current $I_{ref}$ in the range of 50 to 100 microamperes dictated by a reference cell CR. During the phase of measurement of the leakage current of the cell CM, a zero voltage is applied to the control gate of the transistor TCM and the current $I_{cell}$ corresponds to the leakage current of the cell CM. The value of the current $I_{leakage}$ is typically 10 microamperes. During this phase, the current $I_{cell}$ will be compared with a maximum leakage current $I_{leakage}$. To do this, the reference line LR is connected to a particular cell CR. This cell is particular in that, when zero voltage is applied to its gate, it is crossed by a current $I_{ref}$ equal to $I_{leakage}/k$.

Since the value of the current $I_{ref}$ is too small to accurately bias the current mirror (T3, T4), the current given by the current sources SC1 and SC2 will enable compensation for the low value of the current flowing in the lines LB and LR during the measurement of the leakage current and thus enable the transistors T3 and T4 to work properly. Furthermore, so that the copying of current in the current mirror may be maintained with a ratio k, the value taken is I2 =k*I1. Naturally, the current $I_{ref}$ could also be given by any circuit of the stable current generator type.

During the phase for the measurement of the leakage current, the pass transistors T5 and T6 are on and then I3=$I_{ref}$+I1 and I4=$I_{cell}$+I2 are obtained. Since I2=k*I1 and $I_{ref}$=$I_{leakage}$/k, in taking into account the ratio k dictated by the current mirror, it is deduced therefrom that if $I_{cell}$>$I_{leakage}$, then the output signal of the differential amplifier AD is a logic "0" and, if not, then the output signal is a logic "1". Thus, at output of the amplifier AD, a logic information element is obtained indicating whether the leakage current of the memory cell CM is greater than or not greater than the limit value $I_{leakage}$, and it is then possible therefrom to deduce whether the cell CM is defective or not. During the other phases, especially during the reading phase, the current sources SC1 and SC2 are not connected to the bit lines LB and LR.

According to one variant, it is possible to envisage the connection, during the phase for the measurement of the leakage current of a memory cell, of the reference line LR successively to several reference cells each laying down a different current $I_{ref}$ to obtain more precise information on the value of the leakage current of the cell tested. According to another alternative embodiment, it may be planned to bring about a linear variation of the reference current $I_{ref}$ to determine the exact value of the leakage current.

That which is claimed is:

1. A memory in integrated circuit form comprising:
   a plurality of memory cells;
   at least one reference cell;
   at least one reference line connected to said at least one reference cell;
   at least one bit line connected to said memory cells;
   a read circuit comprising comparison means and precharging means for the precharging said at least one bit line and said at least one reference line, said comparison means comprising
      a reference transistor and a copying transistor with a ratio k of current flowing in the reference transistor, said transistors being respectively connected to the reference line and to the bit line through said precharging means, and
      a differential amplifier connected to said reference transistor and said copying transistor; and
   a first current source connected to the reference line and a second current source connected to the bit line to provide first and second currents, respectively, in a direction tending to modify a bias of said comparison means during a phase for measuring a leakage current of at least one of said memory cells, the second current being equal to about k times the first current and a reference current flowing in the reference line being equal to about 1/k times a maximum predetermined leakage current.

2. A memory according to claim 1, further comprising means for preventing the first and second current sources from delivering current except during the phase for the measurement of the leakage current.

3. A memory according to claim 1, wherein the reference cell is a current generator giving the reference current.

4. A memory comprising:

a plurality of memory cells;

at least one reference cell;

at least one reference line connected to said at least one reference cell;

at least one bit line connected to said memory cells;

comparison means comprising
   a reference transistor and a copying transistor with a ratio k of current flowing in the reference transistor, said transistors being respectively connected to the reference line and to the bit line, and
   a differential amplifier connected to said reference transistor and said copying transistor; and a first current source connected to the reference line and a second current source connected to the bit line to provide first and second currents, respectively, in a direction tending to modify a bias of said comparison means during a phase for measuring a leakage current of at least one of said memory cells, the second current being equal to about k times the first current and a reference current flowing in the reference line being equal to about 1/k times a maximum predetermined leakage current.

5. A memory according to claim 4, further comprising means for preventing the first and second current sources from delivering current except during the phase for the measurement of the leakage current.

6. A memory according to claim 4, wherein the reference cell is a current generator giving the reference current.

7. A memory in integrated circuit form comprising:

a plurality of memory cells;

at least one reference cell;

at least one reference line connected to said at least one reference cell;

at least one bit line connected to said memory cells;

comparison means comprising
   a reference transistor and a copying transistor with a ratio k of current flowing in the reference transistor, said transistors being respectively connected to the reference line and to the bit line, and
   a differential amplifier connected to said reference transistor and said copying transistor;

a first current source connected to the reference line and a second current source connected to the bit line to provide first and second currents, respectively, in a direction tending to modify a bias of said comparison means during a phase for measuring a leakage current of at least one of said memory cells, the second current being equal to about k times the first current and a reference current flowing in the reference line being equal to about 1/k times a maximum predetermined leakage current; and means for preventing the first and second current sources from delivering current except during the phase for the measurement of the leakage current.

8. A memory according to claim 7, wherein the reference cell is a current generator giving the reference current.

9. A method for determining leakage current in a memory of a type comprising plurality of memory cells, at least one reference cell, at least one reference line connected to said at least one reference cell, at least one bit line connected to said memory cells, and a read circuit comprising a reference transistor and a copying transistor being respectively connected to the reference line and to the bit line, and a differential amplifier connected to said reference transistor and said copying transistor; the method comprising the steps of:

providing the reference and copying transistor to have a ratio k of current flowing in the reference transistor; and generating a first current connected to the reference line and generating a second current connected to the bit line to provide first and second currents, respectively, during a phase for measuring a leakage current of at least one of said memory cells, the second current being equal to about k times the first current and a reference current flowing in the reference line being equal to about 1/k times a maximum predetermined leakage current.

10. A method according to claim 9, further comprising the step of preventing the first and second current flows except during the phase for the measurement of the leakage current.

* * * * *